United States Patent
Sugahara et al.

(10) Patent No.: US 6,927,149 B2
(45) Date of Patent: Aug. 9, 2005

(54) NITRIDE SEMICONDUCTOR DEVICE AND FABRICATION METHOD THEREOF, AND METHOD FOR FORMING NITRIDE SEMICONDUCTOR SUBSTRATE

(75) Inventors: Gaku Sugahara, Nara (JP); Yasutoshi Kawaguchi, Kadoma (JP); Akihiko Ishibashi, Osaka (JP); Toshiya Yokogawa, Nara (JP); Atsushi Matsubara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/890,263

(22) Filed: Jul. 14, 2004

(65) Prior Publication Data

US 2004/0251519 A1  Dec. 16, 2004

Related U.S. Application Data (63) Continuation of application No. PCT/JP04/00201, filed on Jan. 14, 2004.

(30) Foreign Application Priority Data

Jan. 14, 2003 (JP) .......................................... 2003-005685
Jun. 18, 2003 (JP) .......................................... 2003-173173

(51) Int. Cl.[7] .......................... H01L 21/18; H01L 29/20; H01L 31/0304; C30B 29/38; C30B 29/40
(52) U.S. Cl. ................ 438/481; 257/615; 117/DIG. 952
(58) Field of Search .................. 117/84, 106, DIG. 952; 257/103, 183, 201, 613, 615; 438/46, 47, 478, 479, 481; 372/43, 75, 109

(56) References Cited

U.S. PATENT DOCUMENTS

| | | | | |
|---|---|---|---|---|
| 5,010,033 A | * | 4/1991 | Tokunaga et al. | 117/89 |
| 5,281,283 A | * | 1/1994 | Tokunaga et al. | 148/33.2 |
| 6,153,010 A | * | 11/2000 | Kiyoku et al. | 117/95 |
| 6,363,515 B1 | * | 3/2002 | Hayakawa | 257/639 |
| 6,380,051 B1 | * | 4/2002 | Yuasa et al. | 438/481 |
| 6,413,627 B1 | * | 7/2002 | Motoki et al. | 428/332 |
| 6,576,571 B2 | * | 6/2003 | Biwa et al. | 438/791 |
| 6,599,362 B2 | * | 7/2003 | Ashby et al. | 117/94 |

FOREIGN PATENT DOCUMENTS

| | | |
|---|---|---|
| EP | 1 104 031 A2 | 5/2001 |
| EP | 1 184 897 A1 | 3/2002 |
| JP | 2000-331947 | 11/2000 |
| JP | 2001-168042 | 6/2001 |
| JP | 2001-176813 | 6/2001 |
| JP | 2001-217503 | 8/2001 |
| JP | 2001-274093 | 10/2001 |
| JP | 2001-342100 | 12/2001 |
| JP | 2002-9004 | 1/2002 |
| JP | 2002-009004 | 1/2002 |
| JP | 2002-110569 | 4/2002 |
| WO | WO 01/84608 A1 | 11/2001 |

* cited by examiner

*Primary Examiner*—Evan Pert
(74) *Attorney, Agent, or Firm*—McDermott Will & Emery LLP

(57) ABSTRACT

A nitride semiconductor device comprising a substrate (101) having trenches (102b) each formed of a cavity and peaks (102a) formed from a group III nitride on the surface thereof; a nitride semiconductor layer (106) formed on the substrate (101); and a nitride semiconductor multilayered structure that is formed on the nitride semiconductor layer (106) and has an active layer, wherein the lattice constant of the substrate (101) is different from that of the group III nitride substance (102a), the substrate (101) has a mask (104a) formed from a dielectric (104), the mask (104a) is formed only on the side surfaces of the peaks (102a), the upper surfaces of the peaks (102a) are exposed and the substrate (101) is exposed in the trenches (102b), a height L1 of the mask (104a) is not less than 50 nm and not more than 5000 nm, a width L2 of the trench (102b) is not less than 5000 nm and not more than 50000 nm, and an aspect ratio L1/L2 of the trenches (102b) is not less than 0.001 and not more than 1.0. This structure enhances the reliability of the nitride semiconductor devices.

28 Claims, 7 Drawing Sheets

NITRIDE SEMICONDUCTOR DEVICE AND FABRICATION METHOD THEREOF, AND METHOD FOR FORMING NITRIDE SEMICONDUCTOR SUBSTRATE

This application is a continuation of PCT/JP04/00201, filed Jan. 14, 2004.

TECHNICAL FIELD

The invention relates to a semiconductor laser, a semiconductor light emitting device, and like semiconductor devices, a fabrication method thereof, and a method for fabricating a nitride semiconductor substrate.

BACKGROUND ART

Nitride semiconductors are excellent candidates as useful materials for short-wavelength light emitting devices because of their wide band gap. Among these, extensive research has been conducted on gallium nitride-based compound semiconductors (GaN, AlGaN, GaInN, AlGaInN, and like GaN-based semiconductors), and both blue and green light emitting diodes (LEDs) have already been put to practical use. Furthermore, a semiconductor laser with oscillation wavelength in the 400-nm band is in strong demand to increase the storage capacity of optical disc apparatuses. For this reason, semiconductor lasers using GaN-based semiconductors have attracted widespread attention, and are now approaching a level of practical use.

It is preferable that a nitride semiconductor bulk substrate be used as a substrate on which the nitride semiconductor crystal is grown. However, because nitride semiconductor bulk substrates are expensive and difficult to obtain, sapphire substrates, SiC substrates, etc., are generally used. However, since these substrates have a lattice mismatch with nitride semiconductor crystals, a GaN layer formed on, for example, a sapphire substrate has a dislocation density of approximately $1 \times 10^9$ cm$^{-2}$. Such dislocations lower the reliability of fabricated semiconductor devices, and therefore ways to reduce the dislocation density have been studied. Specifically, a method for reducing dislocation density by growing crystals in such a manner that cavities are formed between the substrate and the nitride semiconductor layer is known.

For example, Japanese Unexamined Patent Publication No. 2001-274093 discloses a method for forming a semiconductor substrate wherein peaks and trenches are formed on the surface of the substrate on which the crystals are to be grown, and the crystals of a GaN-based compound semiconductor, etc., are grown from the upper portions of the peaks in a lateral direction, the trenches covered by the semiconductor layer thereby forming cavities.

Japanese Unexamined Patent Publication No. 2001-168042 discloses a method for forming a semiconductor substrate wherein the trenches covered by a semiconductor layer form cavities by providing a mask formed from SiO$_2$, etc., on the trenches of a substrate having peaks and trenches on the crystal growth surface, and growing crystals in a lateral direction with the upper portion of the peaks as the starting point.

Japanese Unexamined Patent Publication No. 2002-9004 discloses a method for forming a semiconductor substrate wherein trenches covered by a semiconductor layer become cavities by providing striped peaks on a GaN layer formed on the substrate, forming masks on the bottom and side surfaces of the trenches, and growing crystals in a lateral direction from the upper portions of the peaks.

Figure 10:
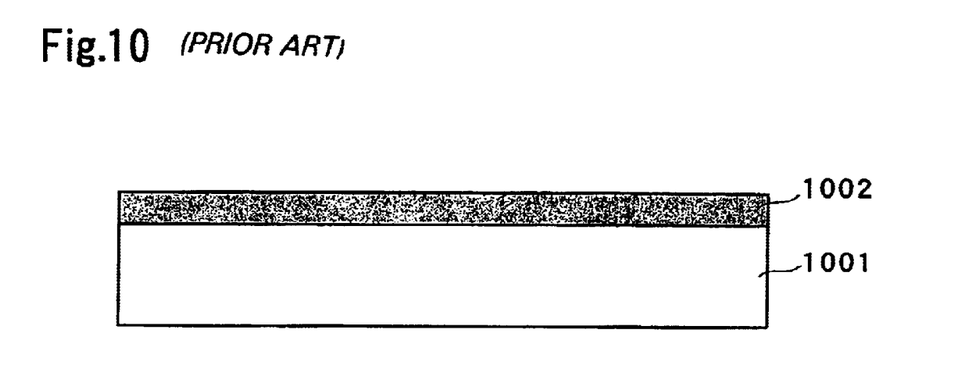
FIGS. 10 to 14 are cross-sectional views of a formation flow explaining a conventional method for forming a nitride semiconductor substrate.
Figure 11:
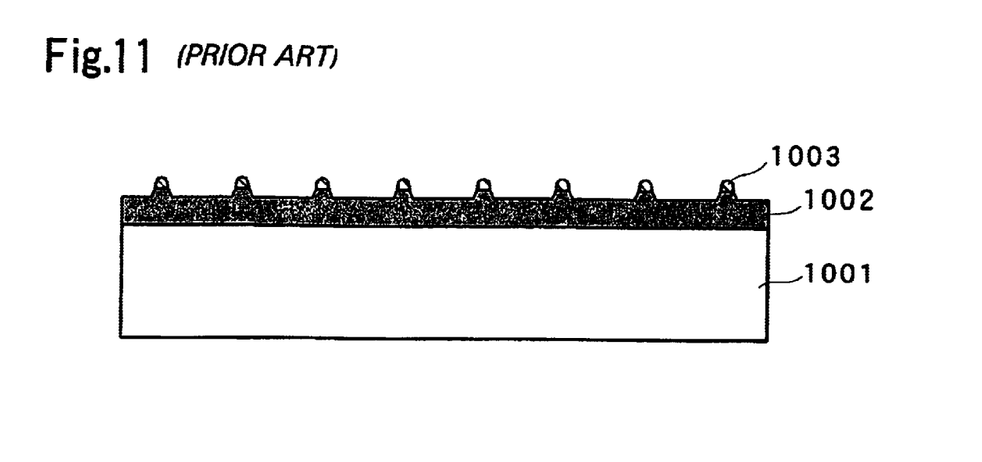
Figure 12:
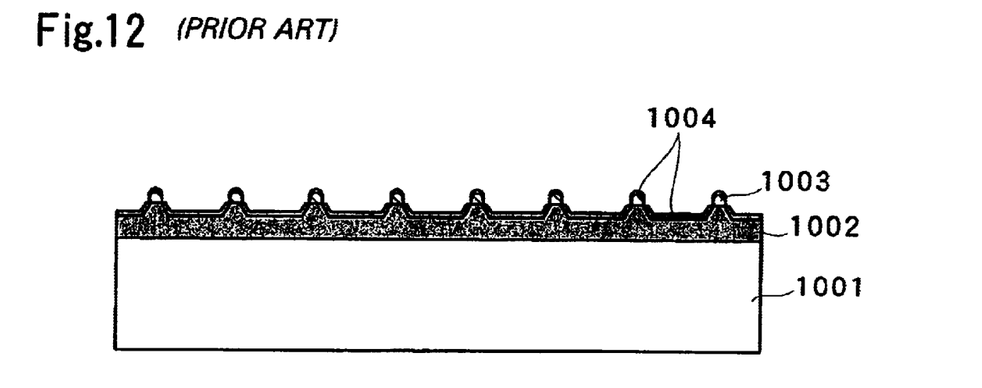
Figure 13:
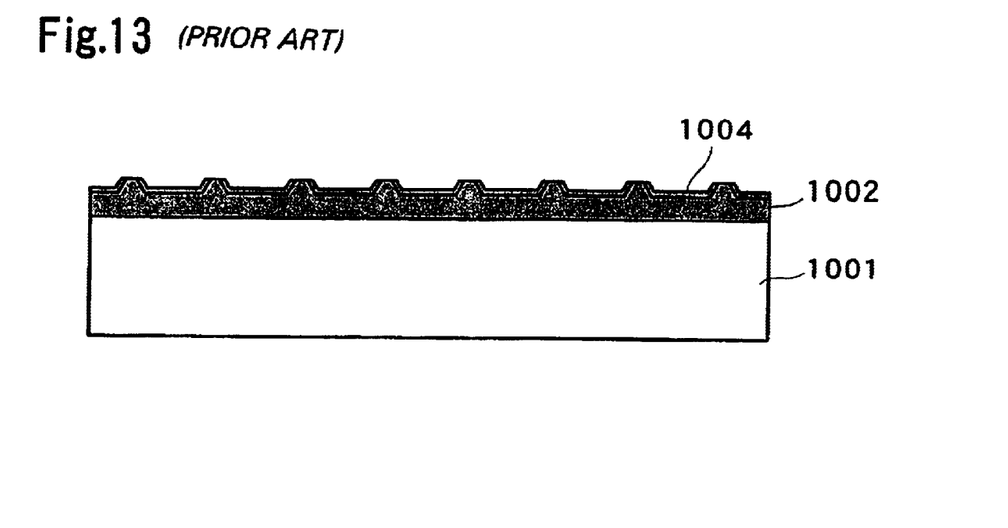
Figure 14:
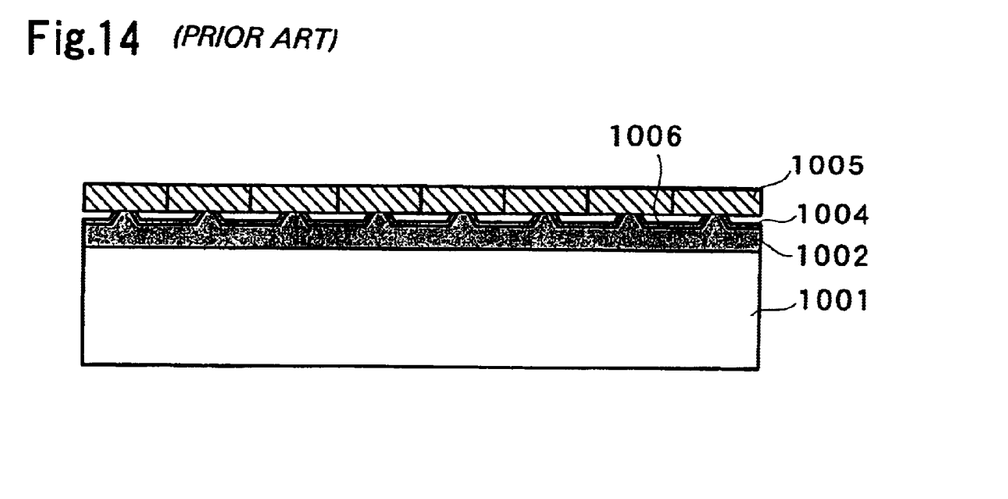

Specifically, as shown in FIG. 10, a GaN buffer layer (not shown) is first deposited on a sapphire substrate 1001 at 500° C. while supplying TMG and NH$_3$, the substrate temperature is then raised to 1020° C., TMG and NH$_3$ are supplied, and a GaN layer 1002 is then deposited. Second, as shown in FIG. 11, a striped resist 1003 is formed on the surface of the GaN layer 1002 by photolithography, and the surface of the GaN layer 1002 is recessed (trenches) by dry etching using the resist 1003 as a mask. As shown in FIG. 12, by ECR sputtering, a dielectric 1004 formed from a silicon nitride film is then deposited over the entire surface of the substrate 1001. As shown in FIG. 13, the resist 1003 and the dielectric 1004 above the resist 1003 is then lifted off. Thereafter, a metal-organic vapor phase epitaxy (MOVPE) technique is employed to conduct selective lateral growth of GaN using the exposed portions of the upper surfaces of the peaks of the GaN layer 1002 as seed crystals. The adjacent GaN crystals that thus grow in the lateral direction become united and a GaN layer 1005, which is a flat, continuous film, as shown in FIG. 14, is formed on the surface of the substrate. As a result, cavities 1006 are formed below the GaN layer 1005.

The methods for forming semiconductor substrates disclosed in the above publications are such that trenches are turned into cavities by growing nitride semiconductor crystals with their starting points in the vicinity of the upper surfaces of the peaks on the substrate; however, in cases where a mask is not provided on the surface of the substrate, as disclosed in Japanese Unexamined Patent Publication No. 2001-274093, or where a mask is provided only on the bottom of the trench, as disclosed in Japanese Unexamined Patent Publication No. 2001-168042, cavities may not be formed below the semiconductor layer.

Japanese Unexamined Patent Publication No. 2002-9004 discloses a method for forming a semiconductor substrate in which masks are formed both on the bottom and side surfaces of trenches in a substrate, thereby making the formation of cavities easier than in conventional methods for forming a semiconductor substrate. However, because the formation of masks is conducted by sputtering, the step coverage of trenches and peaks is not good, and the coverage of the side surfaces of the trenches in the substrate tends to be unsatisfactory. Therefore, there is room for further improving cavity formation between the substrate and the semiconductor layer. Furthermore, because the resist pattern on the upper surfaces of the peaks and nitride silicon film are lifted off, it is difficult to remove the resist pattern on the upper surfaces of the peaks in an even manner, and some of the resist patterns remaining on the upper surfaces of the peaks may prevent crystals from growing.

LIST OF PRIOR ART DOCUMENTS

Japanese Unexamined Patent Publication No. 2001-274093

Japanese Unexamined Patent Publication No. 2001-168042

Japanese Unexamined Patent Publication No. 2002-9004 (the same invention as disclosed in European Patent Publication No. 1104031)

Japanese Unexamined Patent Publication No. 2001-176813

Japanese Unexamined Patent Publication No. 2001-342100 (paragraph 0022)

WO No. 01/84608 (the same invention disclosed in European Patent Publication No. 1278233)

DISCLOSURE OF THE INVENTION

The present invention aims to solve the above problems and provide a highly reliable nitride semiconductor device by forming cavities with certainty between a substrate and a nitride semiconductor layer, the fabrication method thereof, and a method for forming a nitride semiconductor substrate for use in such a semiconductor device.

An object of the present invention is achieved by a method for fabricating a nitride semiconductor device comprising:

a lateral growth step in which a nitride semiconductor layer is formed by growing crystals of a group III nitride in a lateral direction on a substrate having trenches each formed of a cavity and peaks formed from group III nitride on the surface thereof with the upper surfaces of the peaks serving as seed crystals, and a multilayered structure formation step for forming a multilayered structure in which a nitride semiconductor multilayered structure having an active layer is formed on the surface of the nitride semiconductor layer, wherein the lattice constant of the substrate is different from that of the group III nitride, the substrate has a mask formed from a dielectric, crystals of the group III nitride are grown in a lateral direction at a temperature not less than 900° C., the mask is formed only on the side surfaces of the peaks, the upper surfaces of the peaks are exposed and the substrate is exposed in the trenches, a height L1 of the mask is not less than 50 nm and not more than 5000 nm, a width L2 of the trench is not less than 5000 nm and not more than 50000 nm, and an aspect ratio L1/L2 of the trench is not less than 0.001 and not more than 1.0.

Another object of the invention is achieved by a nitride semiconductor device comprising:

a substrate having trenches each formed of a cavity and peaks formed from a group III nitride on the surface thereof;

a nitride semiconductor layer formed on the substrate; and a nitride semiconductor multilayered structure that is formed on the nitride semiconductor layer and has an active layer, wherein the lattice constant of the substrate is different from that of the group III nitride, the substrate has a mask formed from dielectric, the mask is formed only on the side surfaces of the peaks, the upper surfaces of the peaks are exposed and the substrate is exposed in the trenches, a height L1 of the mask is not less than 50 nm and not more than 5000 nm, a width L2 of the trenches is not less than 5000 nm and not more than 50000 nm, and an aspect ratio L1/L2 of the trenches is not less than 0.001 and not more than 1.0.

Still another object of the invention is achieved by a method for fabricating a nitride semiconductor device comprising:

a lateral growth step in which a nitride semiconductor layer is formed by growing crystals of a group III nitride in the lateral direction on a substrate having trenches each formed of a cavity and peaks formed from a group III nitride on the surface thereof with the upper surfaces of the peaks serving as seed crystals, and a separation step in which a nitride semiconductor substrate is obtained by separating the nitride semiconductor layer and the substrate, wherein the lattice constant of the substrate is different from that of the group III nitride, the substrate has a mask formed from a dielectric, crystals of the group III nitride are grown in the lateral direction at a temperature of not less than 900° C., the mask is formed only on the side surfaces of the peaks, the upper surfaces of the peaks are exposed and the substrate is exposed in the trenches, a height L1 of the mask is not less than 50 nm and not more than 5000 nm, a width L2 of the trenches is not less than 5000 nm and not more than 50000 nm, and an aspect ratio L1/L2 of the trenches is not less than 0.001 and not more than 1.0.

BRIEF DESCRIPTION OF THE DRAWINGS

FIGS. 1 to 8 are cross-sectional views of the fabrication flow of a nitride semiconductor substrate according to one embodiment of the present invention. Detailed explanations of FIGS. 1–8 are as below.

FIG. 6 shows a dielectric formation step that forms a layered dielectric 104 on the surface of the substrate 101 having peaks 102a.

FIG. 9 is also a cross-sectional view of a semiconductor device according to one embodiment of the invention fabricated using the nitride semiconductor substrate obtained by the above-described method for forming a nitride semiconductor substrate.

BEST MODE FOR CARRYING OUT THE INVENTION

Embodiments of the present invention are explained below with reference to the drawings. FIGS. 1 to 8 are cross-sectional views of the fabrication flow explaining a method for forming a nitride semiconductor substrate according to one embodiment of the present invention.

Figure 1:
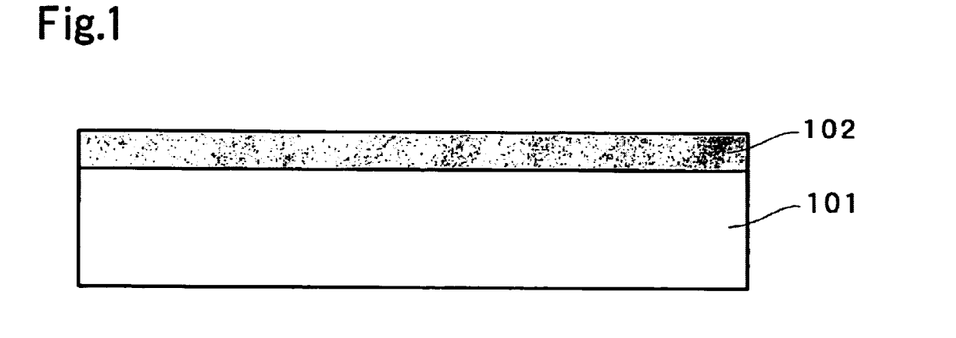
FIG. 1 shows a seed layer formation step in which a seed layer 102 made from a group III nitride is grown on a substrate 101.
Figure 2:
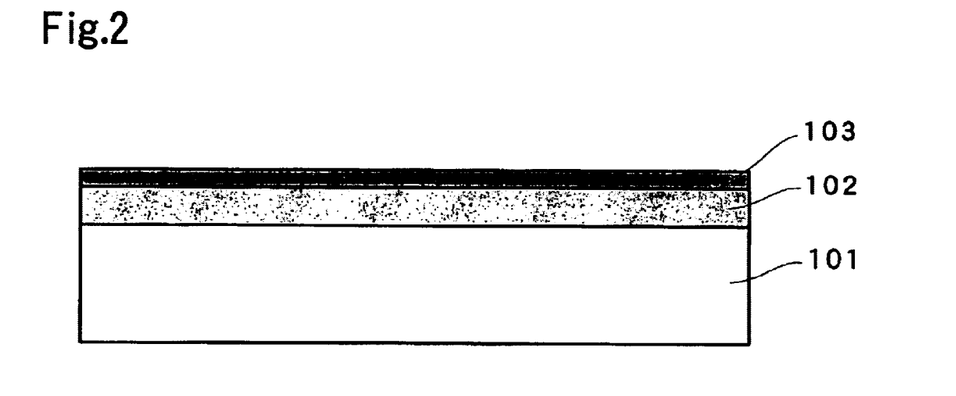
FIG. 2 shows a mask layer deposition step that deposits a peak formation mask layer 103 on the surface of the seed layer 102.

As shown in FIG. 1, a buffer layer (not shown) formed from GaN is first deposited on a substrate 101 at 500° C. while supplying TMG and NH$_3$, the temperature is then raised to 1020° C., TMG and NH$_3$ are supplied, and a seed layer 102 formed from a group III nitride, such as GaN, is then deposited thereon. Second, as shown in FIG. 2, a peak formation mask layer 103 formed from SiO$_2$ is deposited by a plasma CVD method. In the present embodiment, GaN is used as a material for the seed layer 102; however, GaN-based materials containing In or Al can also be used, and it is also possible to use other group III nitrides. Furthermore, while a sapphire substrate is used as the substrate 101 in the present embodiment, it is also possible to use a SiC substrate or other substrates having lattice constants different from those of group III nitrides.

Figure 3:
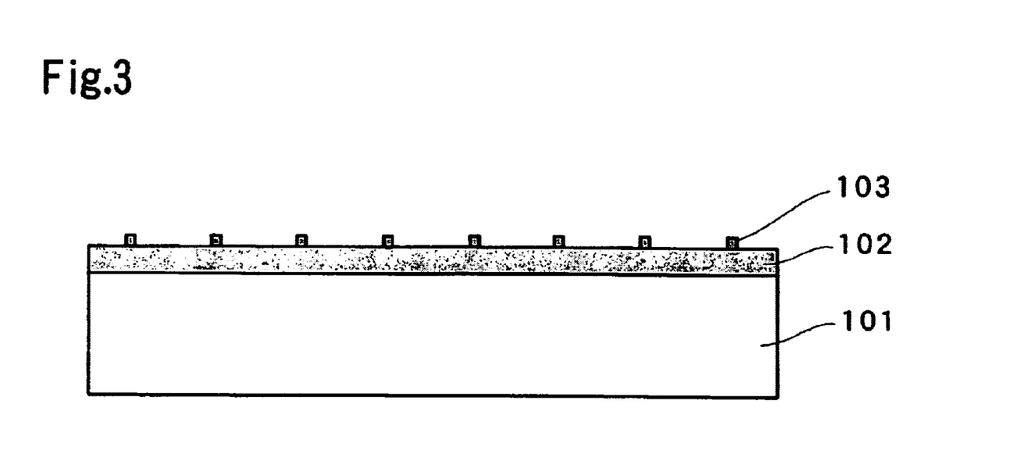
FIG. 3 shows a mask layer patterning step that carries out patterning of the peak formation mask layer 103.

Subsequently, a striped resist pattern (not shown) is formed on the surface of the peak formation mask layer 103 by photolithography. The dimensions of the resist pattern are, for example, a width of 3 μm with a pattern repeat cycle of 15 μm. Using the resist pattern as a mask, reactive ion etching using a fluorine-based gas is performed, and, as shown in FIG. 3, the peak formation mask layer 103 is thereby patterned into a predetermined shape.

Figure 4:
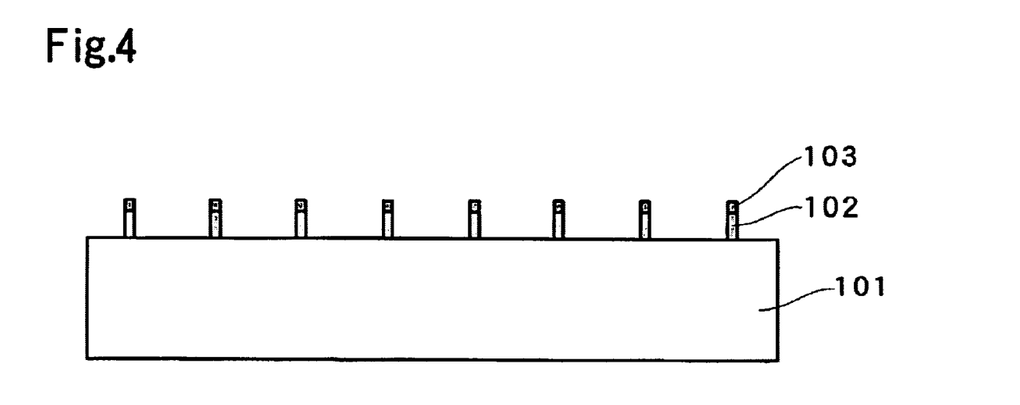
FIG. 4 shows a seed layer etching step that etches the seed layer 102 by using the patterned peak formation mask layer 103 as a mask.

After the resist is removed, using the patterned peak formation mask layer 103 as a mask, the seed layer 102 is patterned into a predetermined shape as shown in FIG. 4 by reactive ion etching using a chlorine-based gas, so that portions of the substrate 101 are exposed.

Figure 5:
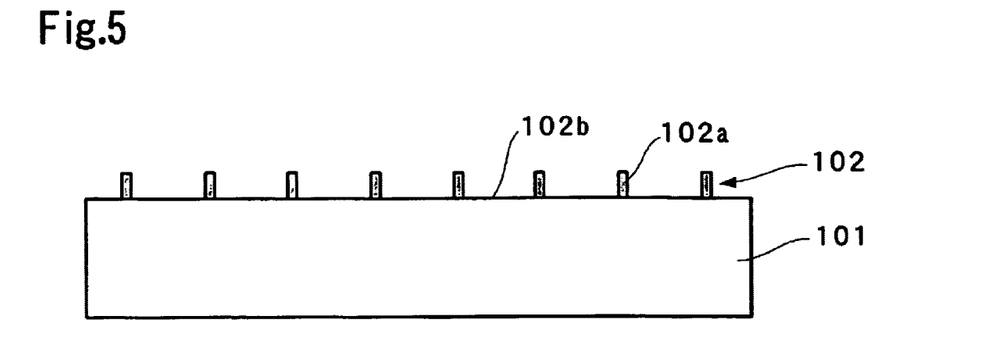
FIG. 5 shows a mask layer removal step that, by removing the peak formation mask layer 103, forms peaks 102a from the seed layer 102 and trenches 102b through which the substrate 101 is exposed.

Subsequently, the peak formation mask layer 103 is removed by wet etching using buffered hydrofluoric acid. As a result, as shown in FIG. 5, a plurality of peaks 102a made from the seed layer 102 are formed on the surface of the substrate 101, and trenches 102b exposing the substrate 101 are formed between the peaks 102a. These trenches 102b will constitute cavities. It is preferable that the side surfaces of the peaks 102a be substantially perpendicular to the surface of the substrate 101 to ease the formation of the mask that is described below. For this, it is desirable that a material (SiO$_2$ in the present embodiment) that can reliably have a relatively large selective etching ratio to the seed layer 102 (GaN in the present embodiment) be used as a material for the peak formation mask layer 103.

Figure 6:
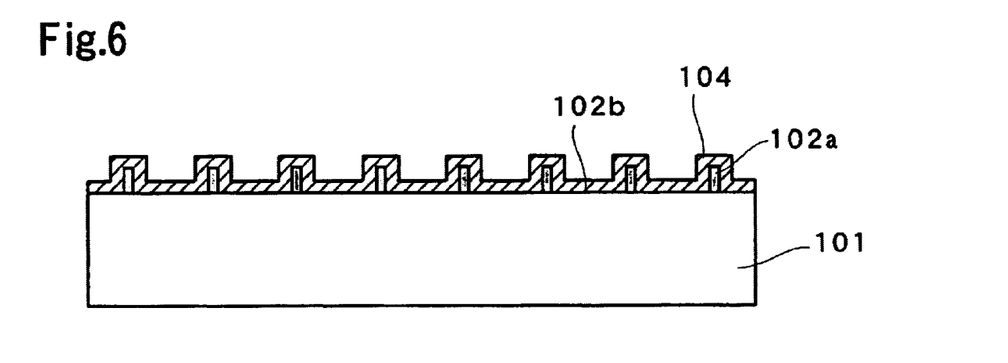

Thereafter, as shown in FIG. 6, a dielectric 104 formed from a silicon nitride film having a thickness of, for example, 300 nm, is deposited by a low pressure chemical vapor deposition (LPCVD) method so as to cover the entire surface of the substrate including peaks 102a and trenches 102b. It is preferable that the dielectric 104 be formed by a method that can obtain a coverage characteristic conforming to the peaks and trenches. Examples of such methods include plasma CVD, atmospheric pressure (ordinary pressure) CVD, photonic CVD, etc., besides the above-explained LPCVD method. It is also possible to form the dielectric 104 from a silicon oxide film, a silicon oxynitride film, an aluminum oxide film, an aluminum oxynitride film, a titanium oxide film, a zirconium oxide film, niobium oxide film, etc., rather than a silicon nitride film, or a multilayered structure of two or more of these. The thickness of the dielectric 104 covering the entire surface of the substrate depends on the height of the peaks 102a, etc.; however, it is preferably not less than 10 nm and not more than 5000 nm, and more preferably not less than 50 nm and not more than 500 nm.

Subsequently, reactive ion etching using a fluorine-based gas is performed on the surface of the substrate. In the reactive ion etching, the thickness of the etched film is controlled by monitoring the plasma luminescence intensity, etc., so that the dielectric 104 that covers the upper surfaces of the peaks 102a and the bottoms of the trenches 102b is removed, and the dielectric 104 formed on the side surfaces of the peaks 102a remains. Typical etching conditions are as follows: introduction gas of CF$_4$ (20 sccm), etching time of 300 seconds, reaction chamber pressure of 6.7 Pa, and electric power of 80 w.

Figure 7:
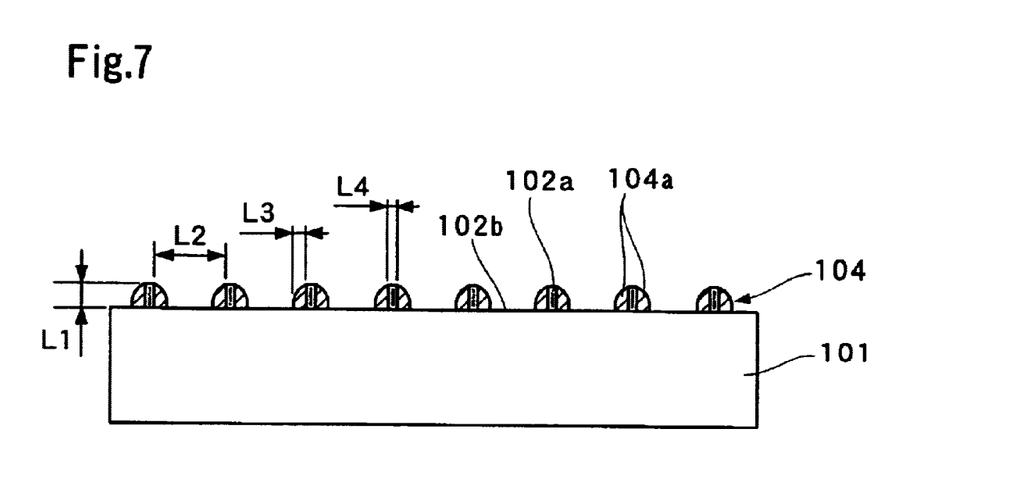
FIG. 7 shows a mask formation step for making a mask 104a made from a dielectric 104 that remains only on the side surfaces of the peaks by performing anisotropic etching of the dielectric 104 to remove the dielectric 104 from the upper surfaces of peaks 102a and the dielectric 104 from the bottoms of trenches 102b.

By performing such anisotropic etching, it is possible to achieve a configuration wherein the substrate 101 is exposed through the bottom surfaces of the trenches 102b, masks 104a made from the dielectric 104 are configured only on the side surfaces of the peaks 102a, and the upper surfaces of the peaks 102a are exposed as shown in FIG. 7.

Subsequently, a semiconductor layer is formed over the surface of the substrate by employing a metal-organic chemical vapor deposition (MOCVD) method. The same group III nitrides can be used as materials for the semiconductor layer as the seed layer 102, and GaN-based materials are particularly preferable. In the present embodiment, TMG (trimethylgallium) is used as the group III material and NH$_3$ (ammonia) is used as the group V material. It is preferable that the ratio of flow rates between the group V material and the group III nitride material (V/III ratio) be 3000–5000, pressure be from $1.3 \times 10^4$ to $4.0 \times 10^4$ Pa, and temperature be from 900 to 1100° C.

Figure 8:
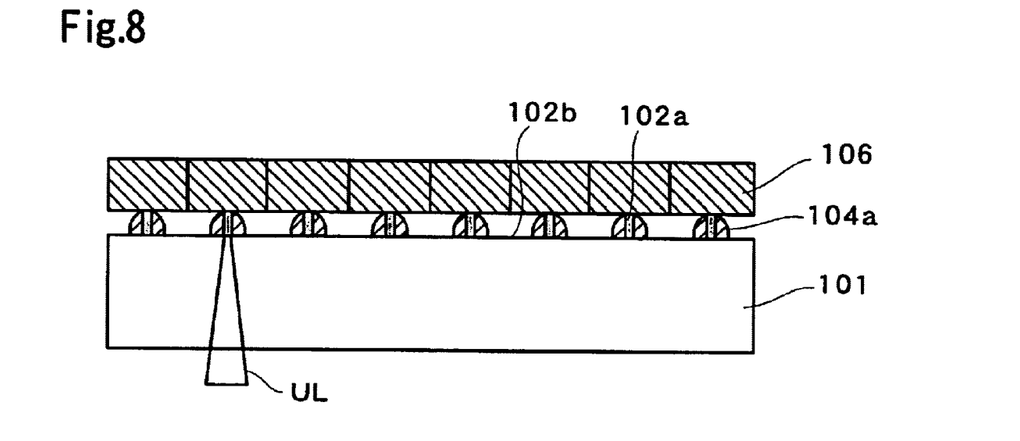
FIG. 8 shows a lateral growth step that forms a nitride semiconductor layer 106 by laterally growing crystals of the group III nitride using the upper surfaces of the peaks 102a as seed crystals over the substrate 101 having trenches 102b each formed of a cavity and peaks 102a formed from the group III nitride on the surface of the substrate 101.

When crystals are grown in the lateral direction under such selective growth conditions having the exposed peaks 102a as seed crystals, grown crystals become connected between the adjacent peaks 102a and a semiconductor layer 106 formed from GaN is formed with the trenches 102b left as cavities as shown in FIG. 8.

Among the conditions for growing crystals for forming the semiconductor layer 106, temperature is particularly important. When the temperature for growing crystals is too low, crystals may be formed on the bottoms of the trenches 102b and cavities may disappear. In contrast, when the temperature is too high, evenness of the side surfaces of the crystals growing in the lateral direction may be impaired. Therefore, as described above, it is necessary that the temperature be not lower than 900° C., and preferably not higher than 1100° C., and more preferably not lower than 950° C. and not higher than 1080° C. Because of the reason as described later, the temperature needs to be not lower than 900° C.

According to the method for fabricating a nitride semiconductor device of the present embodiment, it is possible to reliably leave the masks 104a formed from the dielectric 104 on the side surfaces of the peaks 102a by forming the dielectric 104 on the entire surface of the substrate having peaks and trenches by CVD method, and performing anisotropic etching of the dielectric. As a result, when crystals are grown in the lateral direction from right above the peaks 102a, it is possible to prevent the trenches from being filled with the semiconductor layer 106, and therefore reliably form cavities below the semiconductor layer 106.

Because the peaks 102a formed from GaN are disposed on a substrate 101 made of sapphire, they have crystal defects due to lattice mismatch. Because the crystals grow in the perpendicular direction, when the semiconductor layer 106 is grown, the dislocation density of the semiconductor layer 106 in the vicinity of the peaks 102a is high as approximately $1 \times 10^9$ cm$^{-2}$. In contrast, because the regions right above the trenches 102b of the semiconductor layer 106 are formed by growing crystals in the lateral direction having the peaks 102a as seed crystals, the regions become low dislocation density regions with a dislocation density of approximately $1\times10^7$ cm$^{-2}$. To obtain a nitride semiconductor substrate having a relatively large low dislocation density regions compared to the high dislocation density regions, it is preferable that the width of the trenches 102b be made as large as possible. However, when the width of the trenches 102b is too large, depending on the height of the mask 104a, it may become difficult to maintain cavities between the substrate 101 and the semiconductor layer 106.

In other words, when the height L1 of the mask 104a in FIG. 7 is unduly large, the thickness of the seed layer 102 becomes unduly thick, making the amount of etching required too large. In contrast, when the height L1 of the mask 104a is too small, formation of cavities becomes difficult. Therefore, it is necessary that the height L1 of the mask 104a be not less than 50 nm and not more than 5000 nm, preferably not less than 500 nm and not more than 2000 nm, and more preferably not less than 800 nm and not more than 1200 nm.

When the width L2 of the trenches 102b (distance between the side surfaces of adjacent peaks 102a) is unduly large, formation of cavities becomes difficult. In contrast, when the width L2 of the trenches 102b is unduly small, regions having a low dislocation density cannot be obtained sufficiently. Therefore, it is necessary that the width L2 of the trenches 102b be not less than 5000 nm and not more than 50000 nm, preferably not less than 8000 nm and not more than 20000 nm, and more preferably not less than 10000 nm and not more than 15000 nm.

Furthermore, when the aspect ratio (L1/L2) of the trenches 102b is unduly large, the etching required for forming the peaks 102a becomes excessive. In contrast, when the aspect ratio (L1/L2) of the trenches 102b is unduly small, formation of cavities becomes difficult. Therefore, it is necessary that the aspect ratio (L1/L2) of the trenches 102b be not less than 0.001 and not more than 1.0, preferably not less than 0.01 and not more than 0.5, and more preferably not less than 0.05 and not more than 0.15.

Table 1 shows the results and evaluation of semiconductor substrates having different aspect ratios by varying L1 and L2. As shown in table 1, it was experimentally confirmed that the preferable results were obtained from semiconductor substrates having an aspect ratio (L1/L2) of not less than 0.001 and not more than 1.0.

TABLE 1

| Aspect ratio | L 1 (nm) | L 2 (nm) | | Results |
|---|---|---|---|---|
| 0.0008 | 50 | 60000 | X | Cavities were not formed |
| 0.001 | 50 | 50000 | ○ | Formation of low dislocation density regions was confirmed |
| 0.05 | 1000 | 20000 | ○ | ↑ |
| 0.08 | 1000 | 12000 | ○ | ↑ |
| 1.0 | 5000 | 5000 | ○ | ↑ |
| 1.2 | 5000 | 4200 | X | Formation of sufficient low dislocation density regions was not confirmed |

In the present embodiment, L1 is set at 1000 nm and L2 is set at 12000 nm, and accordingly the aspect ratio (L1/L2) is approximately 0.08.

In FIG. 7, when the width L3 of the mask 104a is unduly large, the necessary film thickness of the dielectric 104 becomes excessive. In contrast, when the width L3 of the mask 104a is unduly small, the anisotropic etching process margin of the dielectric 104 becomes too narrow. Therefore, it is preferable that the width L3 of the mask 104a be not less than 10 nm and not more than 1000 nm, more preferably not less than 50 nm and not more than 500 nm, and still more preferably not less than 100 nm and not more than 300 nm, provided that L3<L2/2. In the present embodiment, L3 is set at 200 nm.

When the width L4 of the peaks 102a is unduly large, the low dislocation density regions of the semiconductor layer 106 become relatively small, and when the width L4 of the peaks 102a is unduly small, formation of seed crystals becomes difficult. Therefore, it is preferable that the width L4 of the peaks 102a be not less than 500 nm and not more than 10000 nm, more preferably not less than 1000 nm and not more than 5000 nm, and still more preferably not less than 2000 nm and not more than 4000 nm. In the present embodiment, the width L4 of the peaks 102a is set at 3000 nm.

The causes for crystals failing to grow on a sapphire substrate 101 are assumed to be as follows:

When TMG, NH$_3$ and like source gases are supplied to a sapphire substrate, crystals of GaN are generally formed on the sapphire substrate.

However, under an atmosphere at a high temperature not lower than 900° C., source material primarily composed of Ga and N that reaches the surface of the sapphire substrate 101 does not bind to sapphire, which has a lattice constant differing from that of crystaline GaN by approximately 14%, and is repelled from the surface of the sapphire substrate 101. This also happens to substrates other than GaN, such as a SiC substrate (i.e., substrates having lattice constants different from that of GaN).

In contrast, in the present invention, because the height L1 of the mask 104a is not less than 50 nm and not more than 5000 nm, the width L2 of the trenches 102b is not less than 5000 nm and not more than 50000 nm, and the aspect ratio L1/L2 of the trenches 102b is not less than 0.001 and not more than 1.0, peaks 102 formed from group III nitrides, such as GaN, exist in the vicinity of the surface of the sapphire substrate 101. It is assumed that, because source material primarily composed of Ga and N that reaches the top of the peaks 102 has a lattice constant substantially the same as that of the peaks 102, crystals of the material can grow from the peaks 102 as seed crystals.

Figure 9:
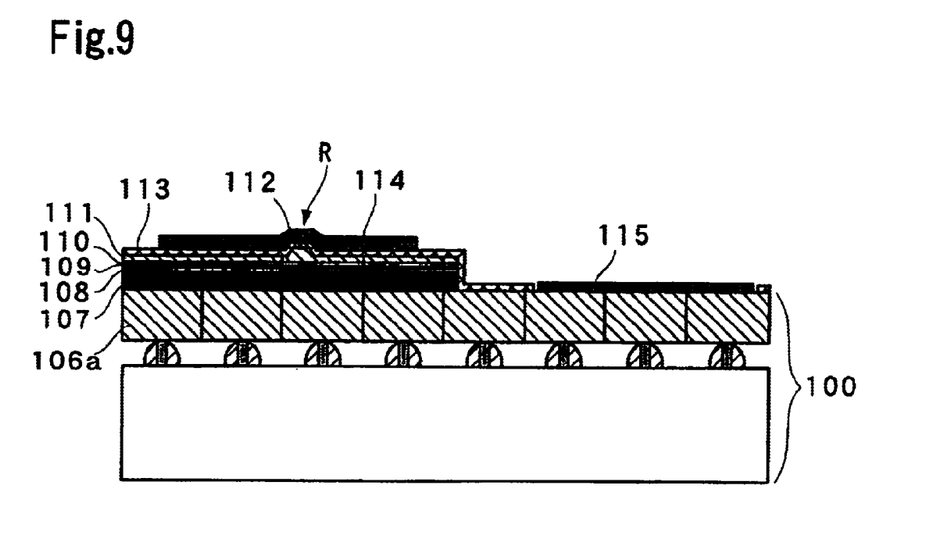
FIG. 9 shows a multilayered structure formation step that forms a nitride semiconductor multilayered structure having an active layer on the surface of the nitride semiconductor layer 106.

As described above, the semiconductor layer 106 as shown in FIG. 8 is formed and a plate-like group III nitride substance composed of the semiconductor layer 106 and the substrate 101 is then obtained. Subsequently, an n-type nitride semiconductor layer, an active layer having a multi-quantum well structure, and a p-type nitride semiconductor layer are laminated in that order as shown in FIG. 9 by a conventional method, obtaining a nitride semiconductor device. The n-type nitride semiconductor layer, active layer, and p-type nitride semiconductor layer are collectively called a nitride semiconductor multilayered structure.

Specifically, after forming the top layer of the nitride semiconductor substrate 100 from an n-GaN layer 106a, an n-Al$_{0.07}$Ga$_{0.93}$N cladding layer 107, an n-GaN optical guiding layer 108, a multi-quantum well (MQW) active layer 109, a p-GaN optical guiding layer 110, a p-Al$_{0.07}$Ga$_{0.93}$N cladding layer 111, and a p-GaN layer 112 are deposited sequentially. The p-GaN layer 112 and the p-Al$_{0.07}$Ga$_{0.93}$N cladding layer 111 are processed into a ridge stripe shape with a width of approximately 2 μm, both ends of the ridge portion R are covered with an insulating film 113, and a current injection region is then formed. The ridge portion R is formed in a low dislocation density region right above the trenches 112b, i.e., the cavities. Furthermore, a p-electrode 114 is formed on a portion of the surface of the insulating film 113 including the p-GaN layer 112, and an n-electrode 115 is formed on a portion of the n-GaN layer 106 exposed by etching.

In the thus obtained semiconductor laser device, by applying a voltage across the p-electrode 114 and n-electrode 115, positive holes from the p-electrode 114 and electrons from the n-electrode 115 respectively are injected into the MQW active layer 109, causing laser oscillation (wavelength 404 nm) by generating optical gain in the MQW active layer 109. This semiconductor laser is enabled by forming a semiconductor multilayered structure comprising an active layer on the surface of the nitride semiconductor substrate of the present embodiment, and therefore the reliability and yield can be enhanced.

After forming the semiconductor layer 106, to obtain a nitride semiconductor substrate, peaks 102a, which serve as seed crystals of the semiconductor layer 106, are radiated with ultraviolet laser light UL (third harmonic Nd: YAG laser (wavelength 355 nm)) from the back surface of the substrate 101. This optically deteriorates the GaN of the peaks 102a and the substrate 101 and the semiconductor layer 106 are separated from each other. A nitride semiconductor substrate comprising the semiconductor layer 106 formed from GaN is thereby manufactured.

The wavelength of the ultraviolet laser beam used to irradiate the substrate 101 is preferably in the range from 150 nm to 400 nm. It is also preferable that the point that the irradiated laser beam comes into a focus be set at the peaks 102a and the beam width be less than the width of the peaks 102a.

As primary methods for scanning the laser beam, the following three examples can be mentioned: (1) a combination of a galvanomirror and an f-θ lens, (2) a combination of a polygonmirror and an f-θ lens, and (3) migration on an x-y stage. To accurately maintain the point where the beam comes into a focus, it is preferable that the scanning be conducted by the method mentioned in item (3), i.e., migration on an x-y stage. Here, it is preferable that the scanning direction be in the stripe direction, i.e., in the GaN <1–100> direction.

To effectively separate the substrate 101 and the semiconductor layer 106, the substrate having a semiconductor layer 106 formed thereon may be subjected to annealing in an inert atmosphere, such as nitrogen, at approximately 1000° C. for 6 hours before irradiating with ultraviolet laser light. In this case, to prevent damage such as escape of N atoms from GaN of the peaks 102a, it is preferable that the annealing temperature be kept not higher than 1200° C.

When the peaks 102a are formed from InGaN, the lattice mismatch between the peaks 102a and the substrate 101 is greater than in the case where the peaks 102a are formed from GaN, and therefore the crystallizability of InGaN is decreased by phase separation, causing defects and the formation of many voids. Phase-separated InGaN is easily deteriorated by thermal energy or optical energy and only the InGaN will be selectively removed by annealing or irradiation of laser light, and therefore the substrate 101 and the GaN-based semiconductor layer 106 can readily be separated from each other.

INDUSTRIAL APPLICABILITY

As described above, the present invention can provide highly reliable nitride semiconductor devices and fabrication methods thereof, and nitride semiconductor substrates used for fabricating such nitride semiconductor devices by reliably forming cavities between the substrate and the nitride semiconductor layer.

What is claimed is:

1. A method for fabricating a nitride semiconductor device comprising:

a lateral growth step in which a nitride semiconductor layer is formed by growing crystals of a group III nitride in a lateral direction on a substrate having trenches each formed of a cavity and peaks formed from group III nitride on the surface thereof with the upper surfaces of the peaks serving as seed crystals, and a multilayered structure formation step for forming a multilayered structure in which a nitride semiconductor multilayered structure having an active layer is formed on the surface of the nitride semiconductor layer, wherein the lattice constant of the substrate is different from that of the group III nitride, the substrate has a mask formed from a dielectric, crystals of the group III nitride are grown in a lateral direction at a temperature not less than 900° C., the mask is formed only on the side surfaces of the peaks, the upper surfaces of the peaks are exposed and the substrate is exposed in the trenches, a height L1 of the mask is not less than 50 nm and not more than 5000 nm, a width L2 of the trench is not less than 5000 nm and not more than 50000 nm, and an aspect ratio L1/L2 of the trench is not less than 0.001 and not more than 1.0.

2. A method for fabricating a nitride semiconductor device according to claim 1, wherein the lateral growth step comprises:

a seed layer formation step in which a seed layer formed from a group III nitride is grown on the substrate, a mask layer deposition step in which a peak formation mask layer is deposited on the surface of the seed layer, a mask layer patterning step in which the peak formation mask layer is patterned into a predetermined shape, a seed layer etching step in which the seed layer is etched using the peak formation mask layer that has been subjected to patterning as a mask, a mask layer removal step in which peaks formed from the seed layer and trenches having the substrate exposed are formed by removing the peak formation mask layer, a dielectric formation step in which a layered dielectric is formed on the surface of the substrate having the peaks, and a mask formation step in which masks formed from the dielectric are left only on the side surfaces of the peaks by removing the dielectric on the upper portions of the peaks and the bottoms of the trenches by anisotropically etching the dielectric.

3. A method for fabricating a nitride semiconductor device according to claim 1, wherein the nitride semiconductor layer is formed by growing crystals at a temperature not higher than 1100° C.

4. A method for fabricating a nitride semiconductor device according to claim 1, wherein the group III nitride is a GaN-based material.

5. A method for fabricating a nitride semiconductor device according to claim 1, wherein the substrate is a sapphire substrate.

6. A method for fabricating a nitride semiconductor device according to claim 1, wherein a width L3 of the mask is not less than 10 nm and not more than 1000 nm.

7. A method for fabricating a nitride semiconductor device according to claim 1, wherein a width L4 of the peaks is not less than 500 nm and not more than 10000 nm.

8. A method for fabricating a nitride semiconductor device according to claim 1, wherein the semiconductor layer is formed by growing crystals under a pressure of not less than $1.3 \times 10^4$ Pa and not more than $4.0 \times 10^4$ Pa.

9. A method for fabricating a nitride semiconductor device according to claim 1, wherein the semiconductor layer is formed by growing crystals with a source material rate-of-flow ratio between group V elements and group III elements (V/III ratio) of not less than 3000 and not more than 5000.

10. A nitride semiconductor device comprising: a substrate having trenches each formed of a cavity and peaks formed from a group III nitride on the surface thereof;
a nitride semiconductor layer formed on the substrate; and
a nitride semiconductor multilayered structure that is formed on the nitride semiconductor layer and has an active layer, wherein
the lattice constant of the substrate is different from that of the group III nitride,
the substrate has a mask formed from dielectric,
the mask is formed only on the side surfaces of the peaks, the upper surfaces of the peaks are exposed and the substrate is exposed in the trenches,
a height L1 of the mask is not less than 50 nm and not more than 5000 nm,
a width L2 of the trenches is not less than 5000 nm and not more than 50000 nm, and
an aspect ratio L1/L2 of the trenches is not less than 0.001 and not more than 1.0.

11. A nitride semiconductor device according to claim 10, wherein the group III nitride is a GaN-based material.

12. A nitride semiconductor device according to claim 10, wherein the substrate is a sapphire substrate.

13. A nitride semiconductor device according to claim 10, wherein a width L3 of the mask is not less than 10 nm and not more than 1000 nm.

14. A nitride semiconductor device according to claim 10, wherein a width L4 of the peaks is not less than 500 nm and not more than 10000 nm.

15. A method for fabricating a nitride semiconductor substrate comprising:
a lateral growth step in which a nitride semiconductor layer is formed by growing crystals of a group III nitride in the lateral direction on a substrate having trenches each formed of a cavity and peaks formed from a group III nitride on the surface thereof with the upper surfaces of the peaks serving as seed crystals, and
a separation step in which a nitride semiconductor substrate comprising the nitride semiconductor layer is obtained by separating the nitride semiconductor layer and the substrate, wherein
the lattice constant of the substrate is different from that of the group III nitride,
the substrate has a mask formed from a dielectric,
crystals of the group III nitride are grown in the lateral direction at a temperature of not less than 900° C.,
the mask is formed only on the side surfaces of the peaks, the upper surfaces of the peaks are exposed and the substrate is exposed in the trenches,
a height L1 of the mask is not less than 50 nm and not more than 5000 nm,
a width L2 of the trenches is not less than 5000 nm and not more than 50000 nm, and
an aspect ratio L1/L2 of the trenches is not less than 0.001 and not more than 1.0.

16. A method for fabricating a nitride semiconductor substrate according to claim 15, wherein the nitride semiconductor layer and the substrate are separated from each other by irradiating the peaks with a laser in the separation step.

17. A method for fabricating a nitride semiconductor substrate according to claim 15, wherein the lateral growth step comprises:
a seed layer formation step in which a seed layer formed from a group III nitride is grown on the substrate,
a mask layer deposition step in which a peak formation mask layer is deposited on the surface of the seed layer,
a mask layer patterning step in which the peak formation mask layer is patterned into a predetermined shape,
a seed layer etching step in which the seed layer is etched using the peak formation mask layer that has been subjected to patterning as a mask,
a mask layer removal step in which peaks formed from the seed layer and trenches having the substrate exposed are formed by removing the peak formation mask layer,
a dielectric formation step in which a layered dielectric is formed on the surface of the substrate having the peaks, and
a mask formation step in which masks formed from the dielectric are left only on the side surfaces of the peaks by removing the dielectric on the upper portions of the peaks and the bottoms of the trenches by anisotropically etching the dielectric.

18. A method for fabricating a nitride semiconductor substrate according to claim 15, wherein the nitride semiconductor layer is formed by growing crystals at a temperature of not more than 1100° C.

19. A method for fabricating a nitride semiconductor substrate according to claim 15, wherein the group III nitride is a GaN-based material.

20. A method for fabricating a nitride semiconductor substrate according to claim 15, wherein the substrate is a sapphire substrate.

21. A method for fabricating a nitride semiconductor substrate according to claim 15, wherein a width L3 of the mask is not less than 10 nm and not more than 1000 nm.

22. A method for fabricating a nitride semiconductor substrate according to claim 15, wherein a width L4 of the peaks is not less than 500 nm and not more than 10000 nm.

23. A method for fabricating a nitride semiconductor substrate according to claim 15, wherein the semiconductor layer is formed by growing crystals under a pressure of not less than $1.3 \times 10^4$ Pa and not more than $4.0 \times 10^4$ Pa.

24. A method for fabricating a nitride semiconductor substrate according to claim 15, wherein the semiconductor layer is formed by growing crystals with a source material rate-of-flow ratio between group V elements and group III elements (V/III ratio) of not less than 3000 and not more than 5000.

25. A method for fabricating a nitride semiconductor substrate according to claim 15, wherein the peaks are formed from InGaN.

26. A method for fabricating a nitride semiconductor substrate according to claim 15, further comprising the step of thermally treating the substrate in an inert atmosphere between the lateral growth step and the separation step.

27. A method for forming a plate-like group III nitride substance comprising:
  a lateral growth step in which a nitride semiconductor layer is formed by growing crystals of a group III nitride in a lateral direction on a substrate having trenches each formed of a cavity and peaks formed from group III nitride on the surface thereof with the upper surfaces of the peaks serving as seed crystals, wherein
  the lattice constant of the substrate is different from that of the group III nitride,
  the substrate has a mask formed from a dielectric,
  crystals of the group III nitride are grown in a lateral direction at a temperature not less than 900° C.,
  the mask is formed only on the side surfaces of the peaks, the upper surfaces of the peaks are exposed and the substrate is exposed in the trenches,
  a height L1 of the mask is not less than 50 nm and not more than 5000 nm,
  a width L2 of the trenches is not less than 5000 nm and not more than 50000 nm, and
  an aspect ratio L1/L2 of the trenches is not less than 0.001 and not more than 1.0.

28. A plate-like group III nitride substance comprising:
  a substrate having trenches each formed of a cavity and peaks formed from a group III nitride on the surface thereof; and
  a nitride semiconductor layer formed on the substrate, wherein
  the lattice constant of the substrate is different from that of the group III nitride,
  the substrate has a mask formed from dielectric,
  the mask is formed only on the side surfaces of the peaks, the upper surfaces of the peaks are exposed and the substrate is exposed in the trenches,
  a height L1 of the mask is not less than 50 nm and not more than 5000 nm,
  a width L2 of the trenches is not less than 5000 nm and not more than 50000 nm, and
  an aspect ratio L1/L2 of the trenches is not less than 0.001 and not more than 1.0.

* * * * *

UNITED STATES PATENT AND TRADEMARK OFFICE
CERTIFICATE OF CORRECTION

PATENT NO. : 6,927,149 B2
DATED : August 9, 2005
INVENTOR(S) : Gaku Sugahara et al.

It is certified that error appears in the above-identified patent and that said Letters Patent is hereby corrected as shown below:

<u>Title page,</u>
Item [56], References Cited, U.S. PATENT DOCUMENTS, change "6,363,515" to -- 6,362,515 --.

Signed and Sealed this

Eighth Day of November, 2005

JON W. DUDAS
*Director of the United States Patent and Trademark Office*